(12) United States Patent
Ballandras et al.

(10) Patent No.: US 9,496,847 B2
(45) Date of Patent: Nov. 15, 2016

(54) ELECTRO-ACOUSTIC TRANSDUCER WITH PERIODIC FERROELECTRIC POLARIZATION PRODUCED ON A MICROMACHINED VERTICAL STRUCTURE

(71) Applicants: CENTRE NATIONAL DE LA RECHERCHE SCIENTIFIQUE (C.N.R.S), Paris (FR);
(Continued)

(72) Inventors: Sylvain Ballandras, Besancon (FR); Gwenn Ulliac, Besancon (FR);
(Continued)

(73) Assignees: CENTRE NATIONAL DE LA RECHERCHE SCIENTIFIQUE (C.N.R.S), Paris (FR);
(Continued)

( * ) Notice: Subject to any disclaimer, the term of this patent is extended or adjusted under 35 U.S.C. 154(b) by 345 days.

(21) Appl. No.: 14/349,579

(22) PCT Filed: Oct. 5, 2012

(86) PCT No.: PCT/EP2012/069709
§ 371 (c)(1),
(2) Date: Apr. 3, 2014

(87) PCT Pub. No.: WO2013/050521
PCT Pub. Date: Apr. 11, 2013

(65) Prior Publication Data
US 2014/0292155 A1    Oct. 2, 2014

(30) Foreign Application Priority Data
Oct. 5, 2011 (FR) ..................... 11 58963

(51) Int. Cl.
*H03H 9/17* (2006.01)
*H03H 3/04* (2006.01)
(Continued)

(52) U.S. Cl.
CPC ............ *H03H 9/177* (2013.01); *H03H 3/04* (2013.01); *H03H 9/02157* (2013.01); *H03H 9/13* (2013.01); *H03H 9/178* (2013.01); *Y10T 29/42* (2015.01)

(58) Field of Classification Search
CPC ............ H03H 9/02157; H03H 9/177; H03H 9/178; H03H 9/13
(Continued)

(56) References Cited

U.S. PATENT DOCUMENTS

2002/0135270 A1    9/2002  Ballandras et al.
2005/0012568 A1*   1/2005  Aigner ............... H03H 9/0095
                                                    333/187
(Continued)

FOREIGN PATENT DOCUMENTS

JP      2001-044794 A    2/2001
WO      02/07310 A1      1/2002
WO      2010/031924 A1   3/2010

OTHER PUBLICATIONS

International Search Report, dated Jan. 2, 2013, which issued during the prosecution of International Patent Application No. PCT/EP2012/069709, which corresponds to the present application.

*Primary Examiner* — Derek Rosenau
(74) *Attorney, Agent, or Firm* — Troutman Sanders LLP

(57) ABSTRACT

A piezoelectric and ferroelectric bulk wave transducer operating at a predetermined frequency includes a block of substrate, having a first thickness and in a first material, and a piezoelectric and ferroelectric transduction plate, having a length, a width and a second thickness, and in a second
(Continued)

piezoelectric material, first and second metal electrodes covering the plate in the direction of the length thereof. The plate has first and second ferroelectric domains with alternating polarizations, distributed along the length of the plate according to a periodic pattern of pitch. The plate is attached perpendicularly to the block so that the width of the plate and the first thickness of the block are the same direction. The first and second material, the first thickness of the block, the length, the width, the second thickness, the pitch of the plate are configured for generating and trapping bulk waves at the operating frequency of the transducer, guided between both electrodes.

11 Claims, 13 Drawing Sheets

(71) Applicants: UNIVERSITE DE FRANCHE-COMTE, Besancon (FR)

(72) Inventors: Blandine Edouard-Guichardaz, Auxon-Dessous (FR); Florent Bassignot, Besancon (FR); Emilie Courjon, Besancon (FR)

(73) Assignees: UNIVERSITE DE FRANCHE-COMTE, Besancon (FR)

(51) Int. Cl.
*H03H 9/02* (2006.01)
*H03H 9/13* (2006.01)

(58) Field of Classification Search
USPC ........................................ 310/328, 359, 360
See application file for complete search history.

(56) References Cited

U.S. PATENT DOCUMENTS

2006/0066175 A1   3/2006   Yamada
2011/0133857 A1   6/2011   Petit et al.

* cited by examiner

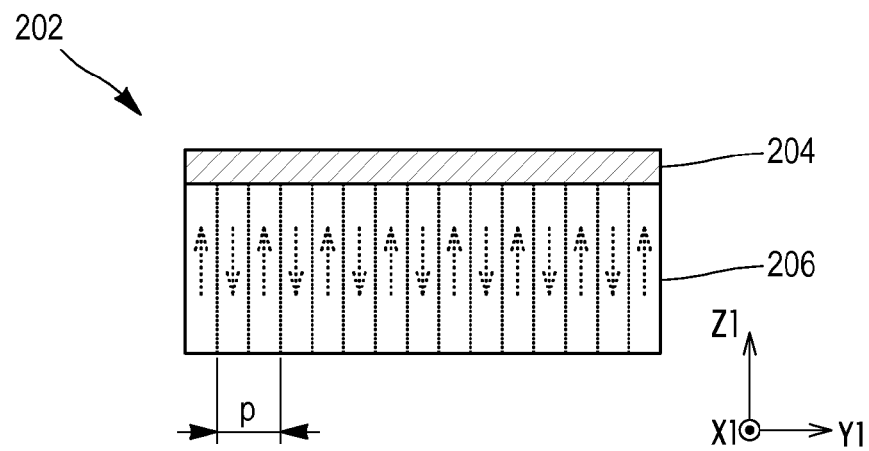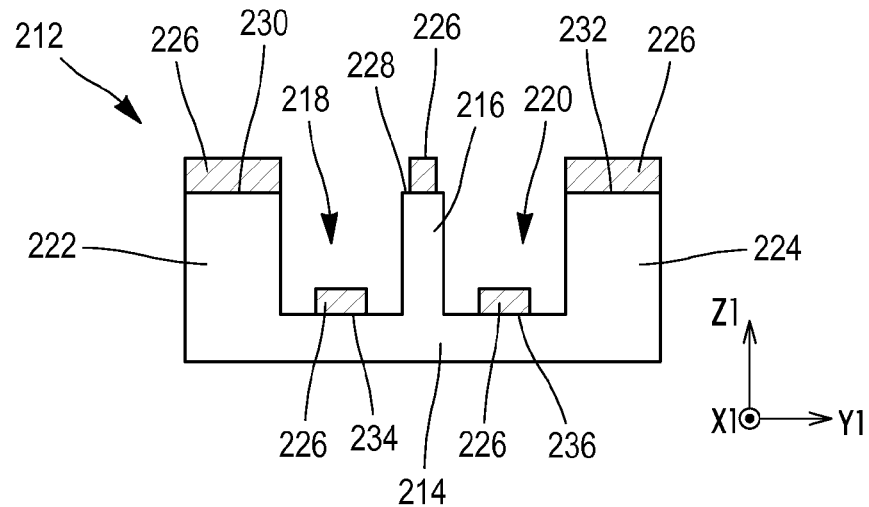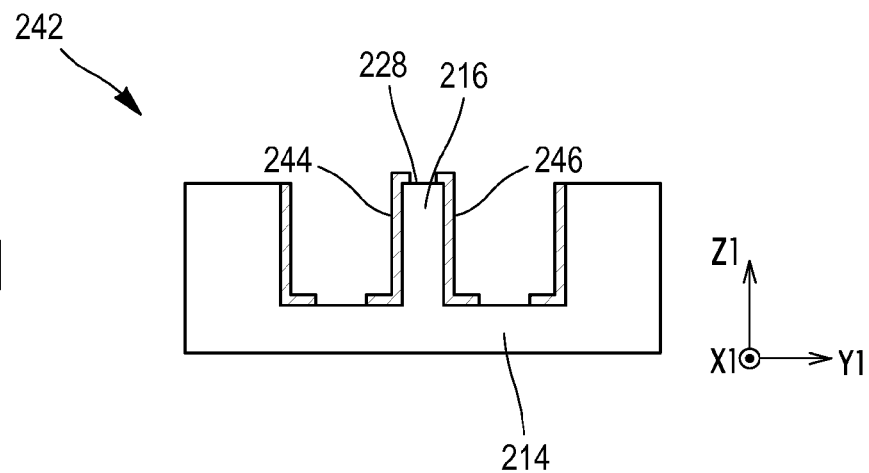

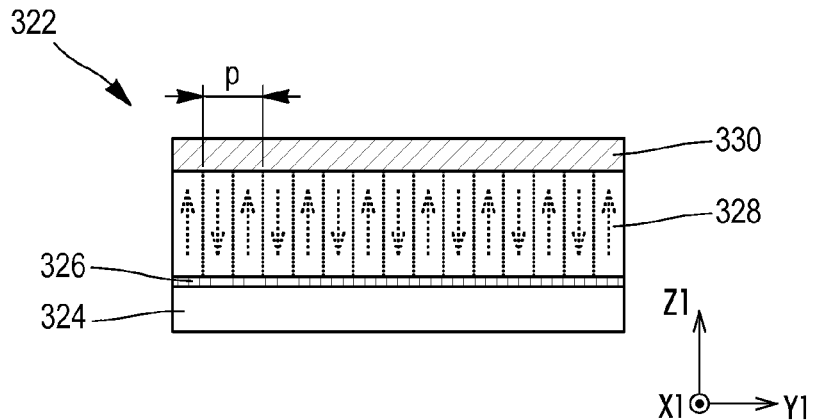
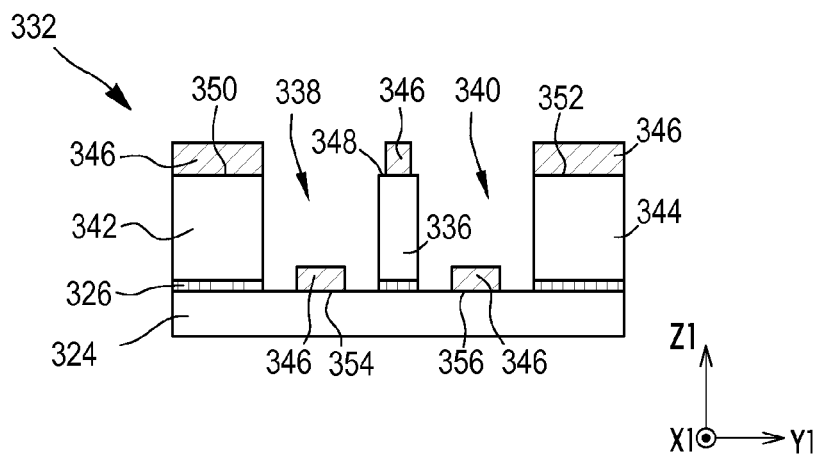
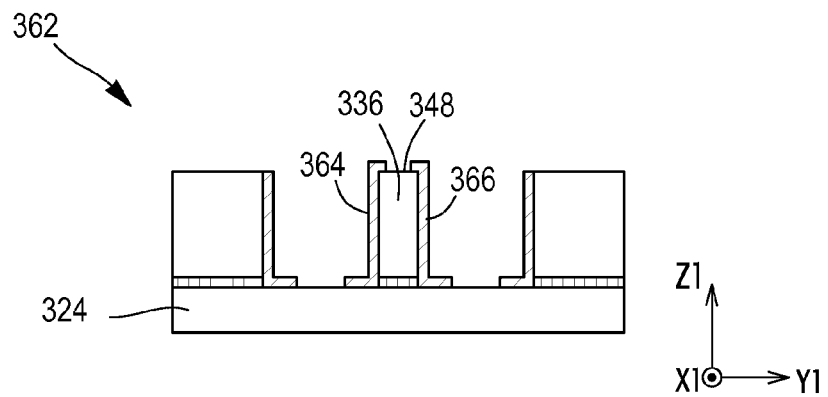

ELECTRO-ACOUSTIC TRANSDUCER WITH PERIODIC FERROELECTRIC POLARIZATION PRODUCED ON A MICROMACHINED VERTICAL STRUCTURE

CROSS REFERENCE TO RELATED APPLICATIONS

The present application is the National Stage of International Application PCT/EP2012/069709 filed Oct. 5, 2012. The International Application claims priority to French Application No. 1158963 filed Oct. 5, 2011. The International Application published as WO 2013/050521 on Apr. 11, 2013. All of the above applications are incorporated by reference.

FIELD OF THE INVENTION

The invention relates to transducers with periodic ferroelectric polarization for excitation of guided elastic waves in micromachined vertical structures and to methods for manufacturing these transducers.

BACKGROUND

Transducers with periodic ferroelectric polarization are widely used in multiple applications with a high operating frequency, for example as resonators playing the role of impedance elements with strong electromechanical coupling for applications to frequency filters, as filtering elements in an oscillation loop for applications to radiofrequency sources, and generally as passive components for radiofrequency signal processing applied to sensors. It should be noted that structures with periodic ferroelectric polarization were initially applied for optical components of the frequency doubler type and as such, they have been optimized in terms of technological achievement.

According to documents WO 02/07310 A1 and WO 2010/031924 A1, it is known how to produce in a planar way piezoelectric transducers with periodic ferroelectric polarization, i.e. having alternating ferroelectric domains. These transducers give the possibility of generating, sustaining and detecting elastic waves guided between two metal surfaces, for which the phase velocities are of the order of 3,800 and 6,500 meters per second, and which are compatible with applications of filters and radiofrequency sources. However, such transducers have quite modest electro-acoustic couplings of a few fractions of percent.

Searching for methods for collectively manufacturing a large amount of piezoelectric transducers with alternating ferroelectric domains on a crystal plate remains a topical subject.

The methods developed up to now essentially consist of making use of lapping/polishing plates, attached flat on a supporting substrate, optionally by adhesive bonding.

This approach is certainly very effective but does not give the possibility of easily controlling plate thicknesses of less than 10 μm.

The technical problem is therefore to improve the manufacturing of plates with thicknesses of less than 10 μm, or in other words improve the manufacturing throughput of plates of piezoelectric transducers with alternating ferroelectric domains for which the thickness is less than 10 μm.

Related, another technical problem is also to improve the integration of several transducers with periodic ferroelectric polarization produced on a same crystal wafer.

Another technical problem is to be able to produce transducers with alternating ferroelectric domains giving the possibility of obtaining higher electro-acoustic couplings.

SUMMARY

For this purpose, the object of the invention is a piezoelectric transducer with bulk waves operating at a predetermined frequency $\underline{f}$ and includes a block of substrate, a holding having a plane face having a first thickness e1 along a normal of the plane face and consisting in a first material, and a piezoelectric transduction plate having first and second plane faces positioned facing each other having a length L, a width $\underline{I}$ and a second thickness e2, and consisting in a second piezoelectric material First and second metal electrodes covering at least partly the first face and the second face of the piezoelectric transduction plate, respectively and at least partly face each other. The piezoelectric transduction plate is formed with a layer of ferroelectric material which comprises first positive polarization domains and second negative polarization domains, the first domains and the second domains being distributed in the direction of the length L of the plate alternately according to a repetition pattern, the repetition pattern being defined by a pitch $\underline{p}$ and a cyclic ratio, and the piezoelectric transduction plate is attached perpendicularly in the vicinity of the plane face of the block of substrate so that the width of the piezoelectric transduction plate and the first thickness of the block of substrate have a same direction, and the first material, the second material, the first thickness of the block of substrate, the length L, the width I, the second thickness e2 of the transduction plate, the pitch $\underline{p}$ are configured for generating and trapping bulk waves at the operating frequency of the transducer guided between its two plane faces, the guided bulk waves propagating in the direction of the length L of the transduction plate.

According to particular examples, the transducer includes one or several of the following features:

- the material has a crystallographic cut noted as ZX according to the IEEE Std-176 Standard revised in 1949, the crystallographic axis X and the crystallographic axis Z being respectively directed along the length L and the width I of the piezoelectric transduction plate, the polarization of the ferroelectric domains being collinear with the axis Z and the repetition axis being directed along the X axis;
- the material has three crystallographic axis X, Y, Z, a crystallographic cut noted as ZX according to the IEEE Std-176 Standard revised in 1949, the crystallographic axis Y and the crystallographic axis Z being respectively directed along the length L and the width I of the piezoelectric transduction plate, the polarization axis of the ferroelectric domains being collinear with the axis Z, and the repertition axis being directed along the axis Y;
- a lateral form factor FI, defined as the ratio of the width $\underline{I}$ of the piezoelectric transduction plate over the second thickness e2 of the piezoelectric transduction plate, is greater than or equal to 5, preferably greater than or equal to 10;
- a longitudinal form factor, defined as the ratio of the length of the transduction plate over the thickness of the resonant plate, is a multiple of wavelengths, greater than or equal to 10, preferably greater than or equal to 100, the wavelength being equal to the phase velocity of the wave divided by the frequency $\underline{f}$;

the piezoelectric transduction plate and the block of substrate consist in a same piezoelectric material and form a part in one piece, wherein the block of substrate comprises first positive polarization domains and second negative polarization domains, the first domains and the second domains of the block of substrate being distributed in the direction of the length of the plate with the same distribution of the ferroelectric polarizations as that of the plate in the direction of the length L;

the piezoelectric transducer comprises an attachment and/or acoustic insulation element at the operating frequency $f$, distinct from the block of substrate and from the piezoelectric transduction plate, consisting in at least one third material distinct from the first and second material, the attachment and/or acoustic insulation element being comprised in the set formed by a single adhesive layer, a Bragg mirror formed with a stack of layers with contrasting acoustic impedances;

the piezoelectric transduction plate and the block of substrate consist in a same piezoelectric material and comprise ferroelectric domains polarized according to a same pattern with identical directions of polarizations and directions;

the crystallographic cut and the polarizations of the ferroelectric domains of the piezoelectric transduction plate are configured so that bulk waves with transverse or longitudinal polarization are generated with an electro-acoustic coupling coefficient greater than 0.01% and guided between both electrodes while propagating in the direction of the length of the plate;

the piezoelectric transduction plate has a constriction area in the direction of the thickness over the whole of its length for which the thickness of the transduction plate passes through a minimum, and the resonant plate being attached to the block of substrate, the constriction area is located in the vicinity of the plane face of the block of substrate;

the first material is comprised in the set of materials formed by diamond-carbon, silicon, sapphire, silicon carbide, quartz, lithium niobate, lithium tantalate, potassium niobate, piezoelectric ceramics, quartz, lithium tetraborate, gallium orthophosphate, langasite, langatate, langanite, silica, the second material is comprised in the set of materials formed by lead oxide, titanium, PZT zirconium, lithium tantalate $LiTaO_3$, lithium niobate $LiNbO_3$, potassium niobate $PbTiO_3$ and ferroelectric materials with high crystalline quality;

the metal electrodes are made in a material comprised in the set of materials formed by aluminum, platinum, iridium, zirconium, rubidium, copper, titanium, molybdenum, nickel, tungsten, gold, poly-silicon, alloys of these different metals, and their thickness is distributed so as to obtain a mass distribution localized at the boundary of the resonant plate and of the block of substrate so as to trap and concentrate the bulk waves inside a local area of the resonant plate.

The object of the invention is also a method for manufacturing a piezoelectric transducer with alternating ferroelectric domains operating at a predetermined frequency using the following steps:

providing an initial piezoelectric transduction plate crude layer, the initial transduction plate crude layer consisting in a piezoelectric and ferroelectric material, having a crude layer thickness eb, and a spatial extension in a plane perpendicular to the direction of the thickness clearly larger than the thickness eb of the crude layer, the initial crude layer comprising first positive polarization domains and second negative polarization domains, the first domains and the second domains being distributed in the direction of a length of the crude layer alternately according to a repetition pattern, the repletion pattern being defined by a pitch $p$ and a cyclic ratio, and the crystallographic orientation of the crude layer and the direction of the ferroelectric polarizations having been selected beforehand so that there exists a crystallographic cut plane of the crude layer in the direction of the thickness eb and of the length of the crude layer for which a wafer, cut out along the cut plane and having a thickness e2, produces, when it is hemmed in by planar metal electrodes normal to the direction of the thickness e2, a ferroelectric piezoelectric transducer with alternating polarizations, wherein guided bulk waves propagate in the direction of the length of the wafer, with an electro-acoustic coupling coefficient greater than or equal to 0.01%, cutting out in the direction of the thickness of the crude layer and partly or totally in the initial resonant plate crude layer, a piezoelectric transduction plate having a resonant plate thickness e2, first and second planar faces positioned facing each other, the plane faces having a length L, a width I and, the cutting out being performed by a machine process along the direction of the cut plane, the width I of the plate and the thickness of the crude layer being of the same direction, the material and the crystallographic orientation of the crude layer, the direction of the cut plane, the length L, the width I, the second thickness of the resonant plate being configured for generating and trapping bulk waves at the operating frequency of the transducer between both of its plane faces, and for creating a guide for guided bulk acoustic waves propagating in the direction of the length L of the transduction plate; and depositing first and second metal electrodes covering at least partly the first face and the second face of the piezoelectric transduction plate, respectively, and at least partly facing each other.

According to particular examples, the manufacturing method includes one or more of the following features:

the manufacturing method comprises the step consisting of partly cutting out in the initial layer and in the direction of the thickness of the initial layer, the resonant plate, the partial cutting out in the thickness of the crude layer being carried out by removal of a first bar adjacent to the plate through the first face, and of a second bar adjacent to the plate through the second face, so as to obtain the resonant plate and the block of substrate as the remainder of the crude layer after cutting out the bars, holding of the plate and having a reference plane face, the plate being attached in only one piece perpendicularly to the plane face of the block of substrate, the width I of the plate thus being a height of the plate relatively to the block of substrate;

the manufacturing method comprises the steps consisting of providing a holding substrate crude layer having a holding substrate crude layer thickness and consisting in a substrate material, and positioning between the holding substrate layer and the transduction plate crude layer at least one layer intended to form an attachment and/or acoustic insulation element at the operating frequency, distinct from the substrate crude layer and from the crude layer of the resonant plate, consisting in at least one third material distinct from the substrate crude layer material and distinct from the resonant plate crude layer, said at least one layer forming the attachment and/or acoustic insulation element being comprised in the set formed by a single adhesive layer, a Bragg mirror formed with a stack of layers with contrasting acoustic impedances, cutting out at least the plate crude layer over a certain depth so as to form the piezoelectric transduction plate; and the step for cutting out the resonant plate is achieved by sawing.

BRIEF DESCRIPTION OF THE DRAWINGS

The invention will be better understood upon reading the description of several examples which will follow, only given as an example and made with reference to the drawings wherein:

FIG. 9 is a view of a first intermediate state of the piezoelectric transducer of FIG. 1 manufactured by the method of FIG. 8;

FIG. 10 is a view of a second intermediate state of the piezoelectric transducer of FIG. 1 manufactured by the method of FIG. 8;

FIG. 11 is a view of a third intermediate state of the piezoelectric transducer of FIG. 1 manufactured by the method of FIG. 8;

FIG. 14 is a view of a first intermediate state of the piezoelectric transducer of FIG. 5 or of FIG. 6 manufactured by the method of FIG. 13;

FIG. 15 is a view of a second intermediate state of the piezoelectric transducer of FIG. 6 or of FIG. 7 manufactured by the method of FIG. 13;

FIG. 16 is a view of a third intermediate state of the piezoelectric transducer of FIG. 6 or of FIG. 7 manufactured by the method of FIG. 13;

DETAILED DESCRIPTION

Figure 1:
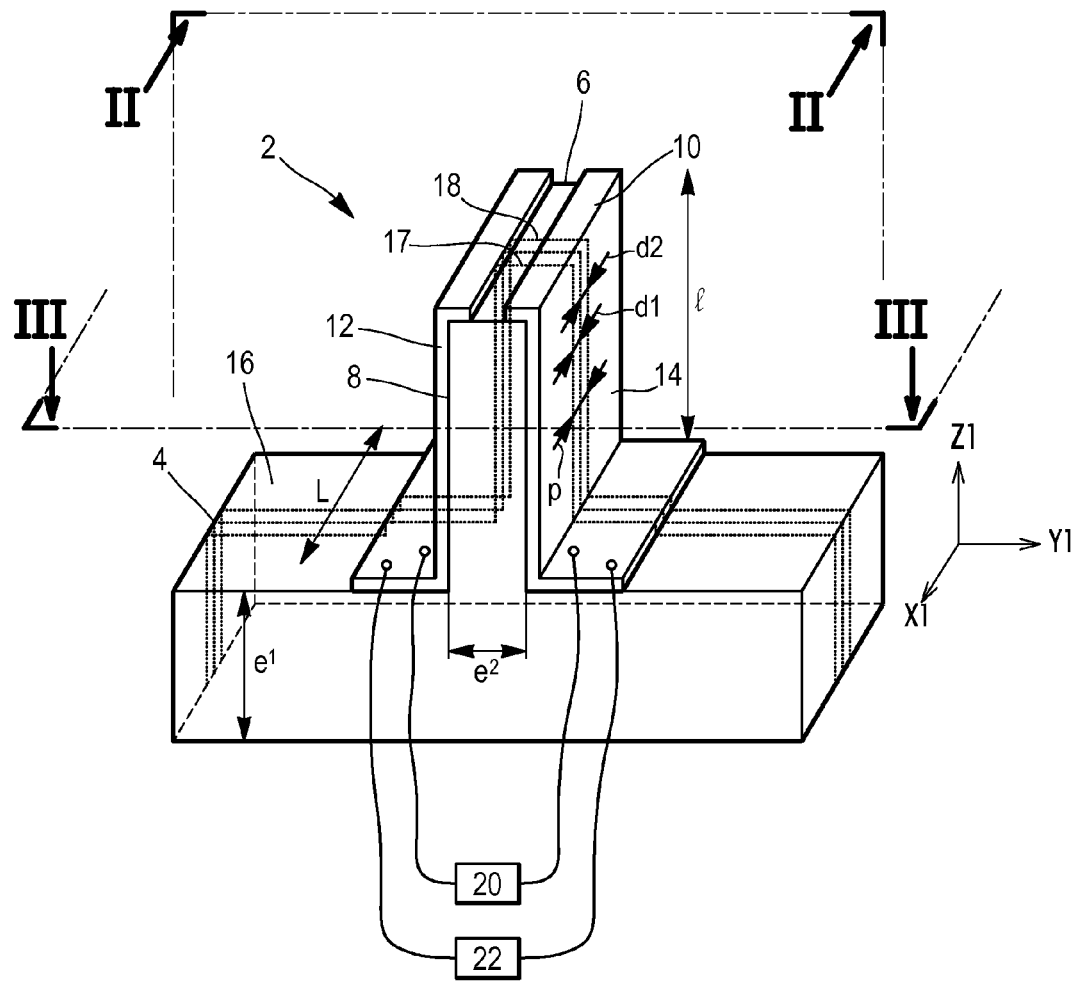
FIG. 1 is a view of an example of a piezoelectric transducer with alternating ferroelectric domains wherein the block of substrate and the piezoelectric transduction plate are in one piece.
Figure 2:
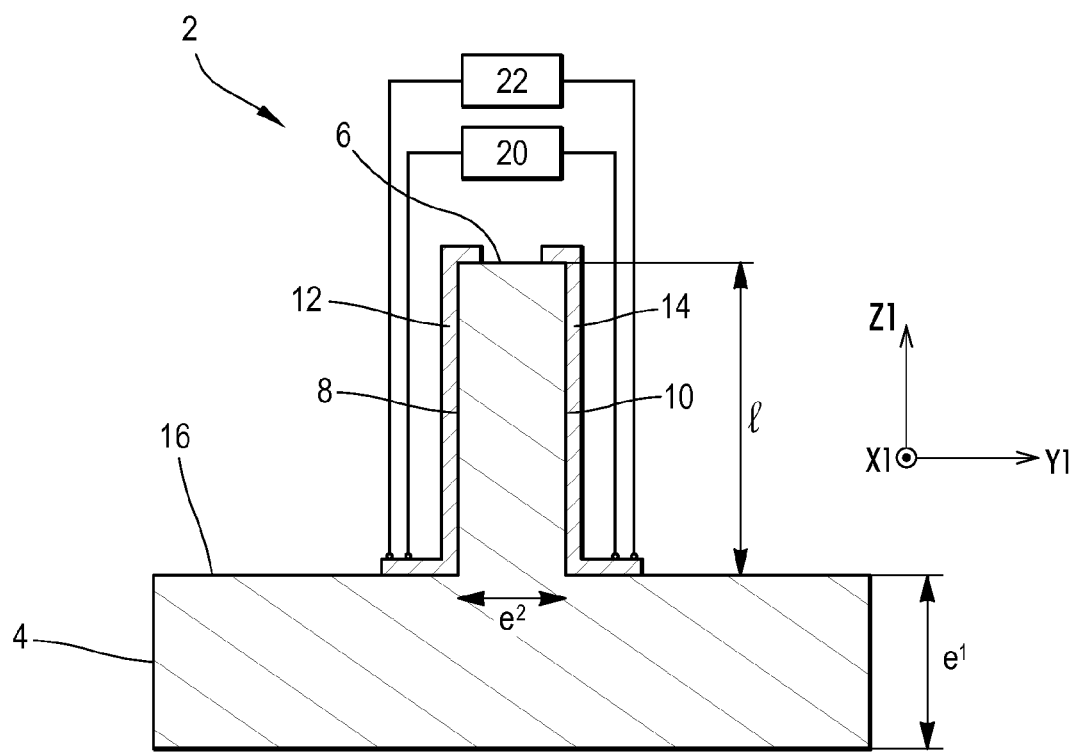
FIG. 2 is a sectional view of the transducer of FIG. 1 in the direction of the width and of the thickness of the piezoelectric transduction plate along the cut plane II-II of FIG. 1.
Figure 3:
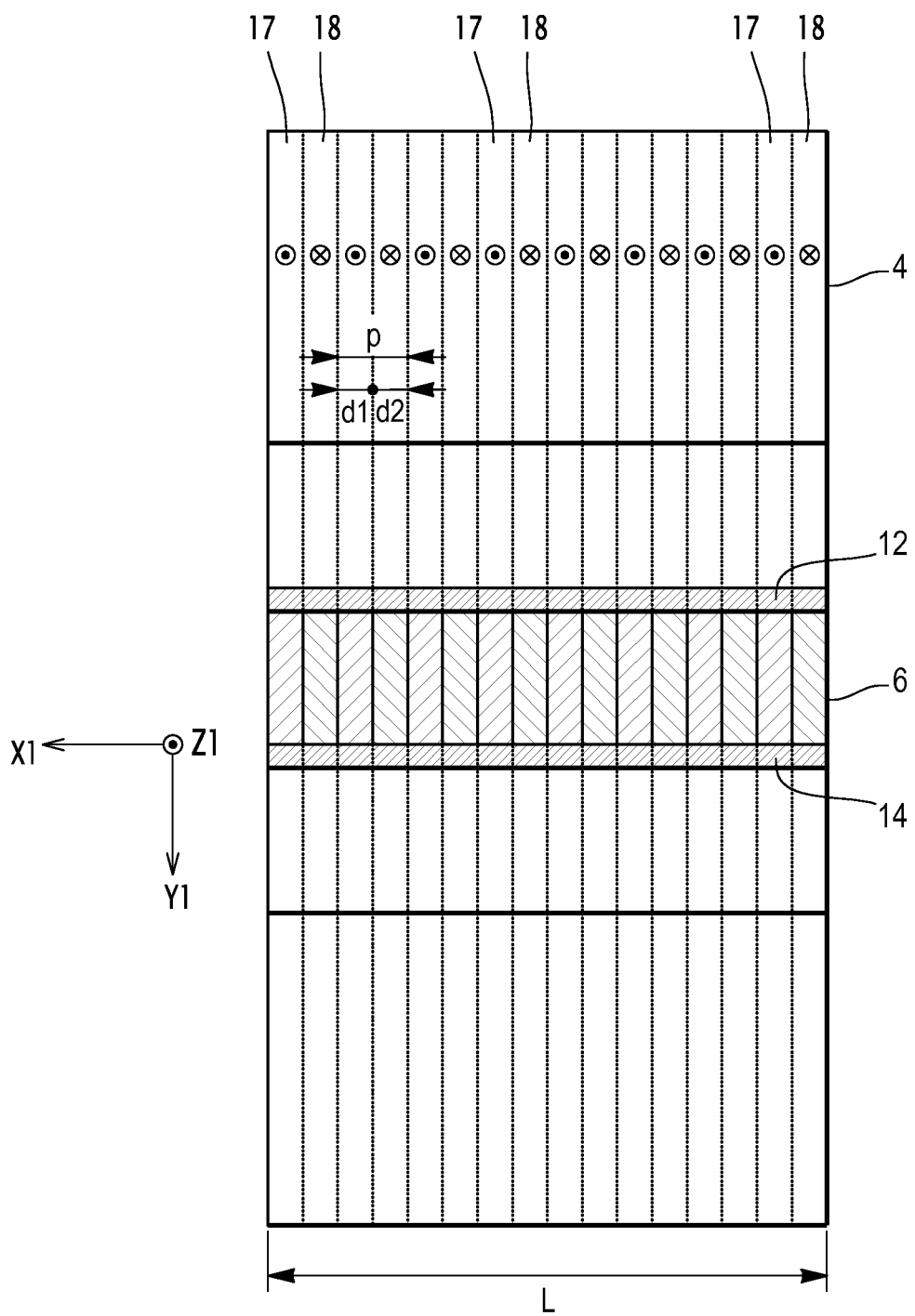
FIG. 3 is a sectional view of a transducer of FIG. 1 at the transduction plate in the direction of the thickness and of the length of the transduction plate along the cut plane III-III of FIG. 1.

According to FIGS. 1, 2 and 3, a piezoelectric transducer 2 with alternating ferroelectric domains, or in other words with periodic ferroelectric polarization is configured for operating at a predetermined desired frequency $f$.

The piezoelectric transducer 2 comprises a block of substrate 4, a piezoelectric and ferroelectric transduction plate 6 having a first face 8 and a second face 10 facing each other, a first metal electrode 12 deposited on the first face 8 and a second metal electrode 14 deposited on the second face 10 of the transduction plate 6.

The block of substrate 4, consisting in a first material, includes a plane face 16 having a first thickness e1 along a normal to the plane face 16 and is used as a support for the transduction plate 6.

The piezoelectric transduction plate 6, consisting in a second piezoelectric material is limited by first and second faces 8, 10. Both faces 8, 10 of the plate 6 are mutually parallel and spaced apart by a distance designated by e2, which distance forms the thickness of the piezoelectric transduction plate 6.

A trihedral reference system with three axis X1, Y1, Z1 orthogonal to each other is defined wherein the axis Z1 is the axis of the normal to the plane face 16, i.e. the vertical axis in FIG. 1, the axis Y1 is the axis directed along the direction of the thickness of the transduction plate 6, and the axis X1 is configured for making the trihedron of the reference system, direct.

Each face 8, 10 of the transduction plate 6 has a length L along the axis X1 and a width $\underline{l}$ along the axis Z1.

Here, the first material and the second material are identical and form a piezoelectric and ferroelectric material comprising alternating ferroelectric domains 17, 18.

For example, the same material is lithium niobate in which ferroelectric domains with alternating polarizations have been generated locally and durably.

Here, in FIG. 1, only two ferroelectric domains 17, 18 of opposite polarization are illustrated while in FIG. 3 an entire sequence of ferroelectric domains with periodic polarization is illustrated.

The ferroelectric domain 17 of a first type has a positive polarity, i.e. it is characterized by a dipolar electric field vector directed in the direction of the positive axis Z1.

The ferroelectric domain 18 of the second type has a negative polarity, i.e. it is characterized by a dipolar electric field vector directed in the direction of the negative axis Z1.

The widths of the ferroelectric domains 17 and 18 along the axis X1 are respectively designated by d1 and d2.

The set formed by the domain of a first type 17 and the domain of a second type 18, adjacent to the first domain 17, forms a repetition pattern of the periodic arrangement of the polarities of the domains 17 and 18.

The width of the pattern which is the spatial period of the periodical arrangement of the ferroelectric polarities is designated by the quantity p and is equal to the sum of the width d1 and of the width d2.

The ratio between the width d1 and the period p or correspondingly, the ratio between the width d2 and the period p designates the cyclic ratio of the pattern.

Here, in FIGS. 1 and 3, it is assumed that the cyclic ratio d1/p is equal to 0.5, i.e. the widths d1 and d2 of the ferroelectric domains are equal.

Alternatively, the directions of the respective ferroelectric polarizations of the ferroelectric domains 17, 18 are different from the direction of the axis Z1.

Advantage is taken from this kind of local polarization for functionalizing or making periodic the electro-acoustical properties of the resulting material so as to manufacture devices with acoustic waves excited by the piezoelectric effect via the ferroelectric material on any type of metal substrate or metallized surface by means of local electric polarization.

Here, the metal substrate is produced by the two metal electrodes 12 and 14.

In a conventional and general way, the piezoelectric and ferroelectric material layer is produced from any mono- poly- or multi-crystalline ferroelectric material, for example lead oxide, titanium, zirconium designated as PZT, lithium niobate $LiNbO_3$, lithium tantalate $LiTaO_3$ or else further potassium niobate $KNbO_3$.

The thickness of the layer of the crude wafer (raw wafer) is conventionally comprised between 10 µm and 1000 µm and is equal to the sum of the thickness e1 of the block of substrate 4 and of the width I of the piezoelectric and ferroelectric transduction plate 6.

The inversion of the ferroelectric domains associated with the production of periodically inverted microstructures may be achieved by applying various techniques.

For example, in order to make lithium niobate $LiNbO_3$ periodically inverted in terms of ferroelectric domains, the following techniques may be used:

growth of the $LiNbO_3$ crystal with a dopant, exo-diffusion of $Li_2O$ on the face Z+, diffusion of titanium on the face Z+, electron bombardment, applying an electric field.

Here, the lithium niobate material either pre-polarized or not, for which the crystallographic cut is noted as ZX according to the IEEE Std-176 standard revised in 1949, was locally subject beforehand selectively along the axis X to a substantial electric field, exceeding the coercitive field and directed along the axis Z, by means of a metal electrode having the shape of a spike or of an apex, or for which the geometry was produced depending on the desired local polarization profile.

The crystallographic axis X, Y, Z of the second material here respectively coincide with the axis X1, Y1, Z1 of the trihedral reference system.

Structures with inversion of the domains with a pitch of the order of a few hundred nanometers may thus be made and are quite adapted to high frequency applications. The lattice pitch p is of the order of the acoustic wavelength.

The frequency f is obtained in a first approximation by dividing the phase velocity of the wave, designated as $v_\varphi$, by the lattice pitch p.

By alternating positive polarization and negative polarization domains, extensions and compressions of material are alternated at the ferroelectric material layer so as to generate constructive acoustic interferences, preferentially propagating in the XY plane of the layer rather than in the volume, the layer having the function of a guide.

It is also possible to define between both flank electrodes 12 and 14 a single piezoelectric transducer which has a well-identified characteristic admittance.

This transducer may subsequently be used in combination with other transducers of the same type (but for which central frequency is different) so as to produce lattice or trellis filters, or else define an input transducer and an output transducer.

The benefit of such a periodically polarized piezoelectric and ferroelectric transducer, lies in the fact that it gives the possibility of manufacturing components with guided elastic waves naturally operating at higher frequencies than the conventional surface wave components (SAW for Surface Acoustic Wave), and having technological robustness greater than that of the devices with interdigitated combs.

According to FIGS. 1 to 3, the piezoelectric transduction plate 6 and the block of substrate 4 form a single part in one piece.

The first and second metal electrodes 12, 14 cover at least partly the first face 8 and the second face 10 of the transduction plate 6 respectively. For achieving excitation of the guided elastic waves, the respective surfaces of the first electrode and of the second electrode are at least partly superposed through the transduction plate.

It should be noted that the underlying idea which led to the design of the piezoelectric transducer of FIG. 1 is first to produce a crude substrate layer of a transducer with periodic ferroelectric polarization along the axis X on a ZX cut of lithium niobate, of lithium tantalate or of any ferroelectric material allowing distributed polarization on a wafer.

The underlying idea is then to thin in the direction of this thickness in any way or another, the crude substrate layer with an initial globally parallelepipedal shape and surrounding the piezoelectric transduction plate which one seeks to make finally, so as to produce a piezoelectric and ferroelectric transducer in the form of a plate or a bar perpendicularly attached to the block of substrate. This operation is made possible by using a saw with a diamond blade polishing the flanks of the bar, thus giving them guiding capabilities compatible with the application.

The use of a blade capable of polishing the faces at the same time as cutting them out, provides the possibility of producing faces compatible with efficient excitation and guiding of waves in the sense of the quality of the resonance. The resulting surface should have roughness from a few tens to a few nanometers as an RMS standard deviation, ideally an optical polish. In any case, roughness of the surfaces facing the resonator of more than 100 nm RMS is not compatible with the quality of the resonance compliant with the standard of acousto-electricity.

The underlying idea finally consists of depositing separate electrodes on the flanks of the wafer with an extension plane ZX.

Consequently, acoustic waves may be electrically excited, guided and trapped in the transduction plate with alternating ferroelectric polarization, the polarization of the elastic waves either being in majority longitudinal or in majority transverse. The transduction plate has a notably high electroacoustic coupling (up to 12% for the longitudinal mode and greater than 20% for the transverse mode) for optimized configurations in terms of period p and of dimensions L, e2, I of the transduction plate, the structure forming the transduction plate being dispersive and imposing control of its dimensional characteristics.

The structure of the transduction plate should be regular in thickness e2 in order to provide optimum resonance conditions, while noting that the nature of the mode and of its dispersion properties dictate said first conditions, i.e. the variation of the spectral properties of the guide as a function of its geometrical characteristics.

It should be noted that from the point of view of the resonator alone, e2 represents the thickness of the material according to which modal dispersion occurs. The thickness e2 may also be considered from a structural point of view as a width of the plate provided that the dimension I of the depth of the plate is considered as a height. The increase in this height I has the effect of improving spectral purity and minimizing the width of the lines corresponding to the modal contributions.

For the first mode excited by the structure, with a longitudinal polarization in majority, the sensitivity of the frequency of synchronism with the thickness of the bar or of the plate varies in the region of stronger coupling by a few percents of MHz per μm, whereas in the case of the shear mode, this sensitivity may change by several tens of percent of MHz (or even more than 100%) per μm.

The longitudinal polarization is defined such that the polarization of the acoustic propagation is collinear with the length L of the plate, or further such that the acoustic wave has quasi-scalar polarization with a dynamic displacement normal to the electric excitation field, along the ferroelectric periodicity. The shear polarization is defined such that the acoustic wave has a quasi-scalar field with a dynamic displacement normal to the lateral faces of the plate and distributed in its thickness, the propagation being always along the periodicity.

Accordingly, the control of the thickness e2 of the plate proves to be critical in order to guarantee a perfectly defined working frequency. In any case, a preferred configuration of the transducer corresponds to a plate with a thickness not varying by more than 5% of the targeted rated value.

Here, according to FIGS. 1 to 3, as example, the transduction plate was cut out along a cut noted as YX according to the IEE Std-176 standard revised in 1949 in a raw substrate, precut along the lithium niobate cut noted as ZX. The cutting out of the resonant plate was carried out by assuming that the electric excitation is applied between both faces 10, 12 of the plate and the direction of propagation of the guided bulk waves is directed along the distribution direction of the ferroelectric domains, i.e. along the direction of the length L of the transduction plate.

The thickness e2 and the width I of the transduction plate are equal to 5 μm and 25 μm respectively.

The ZX cut of the raw substrate is selected for its availability on the one hand since it is a standard for lithium niobate and for its orthogonal cuts (YX) and (YXl)/180° corresponding to the alternating ferroelectric domains polarized along the axis Z, particularly favorable for guided bulk waves along the X axis between plane, parallel faces distant from each other and having ZX as an extension plane.

The thereby machined transduction plate on a lithium niobate cut ZX forming a substrate with ferroelectric domains polarized along the Z axis is therefore equivalent to a configuration of a transducer with guided waves along the X axis for which the frequency is equal to the ratio of the phase velocity $v_\phi$ of the vibration mode over the pitch p.

It should be noted that when the form factor of the transduction plate, designated by FI and equal to the ratio of the width of the plate I over the second thickness e2 is of a low value, here of the order of 5, the relevant structure is penalized by one or more parasitic modes which perturb the vibration mode of the guided waves.

In order to improve this situation several solutions exist.

A first solution consists of extending the width I of the plate in order to promote establishment of useful guided modes between both electrode faces and minimizing the loss of acoustic energy in the vicinity of the block of substrate.

This solution proves to be highly efficient and better results, in terms of a very well resolved resonance of the guided mode, and with high spectral response purity, are obtained when for example the form factor FI is equal to or greater than 15, this case corresponding to a thickness e2 of 5 μm and to a width I or height of 75 μm.

When the form factor FI is still greater, for example equal to 200, the spectral purity of the transducer is improved.

Thus, when the form factor FI is sufficiently high, the quality coefficient of the resonance is only limited by the intrinsic properties of the material making up the transduction plate alone and not by the loss effects by acoustic radiation in the block of substrate.

Generally, the second material making up the transduction plate, is comprised in the set of the materials formed by lead oxide, titanium, PZT zirconium, lithium tantalate $LiTaO_3$, lithium niobate $LiNbO_3$, potassium niobate $PbTiO_3$, and generally ferroelectric materials with high crystalline quality, notably single-crystal ceramics) available in a sufficiently thick plate for allowing technological application of the bars or of the transduction plate.

Generally, the first material is comprised in the set of materials formed by diamond carbon, silicon, sapphire, silicon carbide, quarts, lithium niobate, lithium tantalate, potassium niobate, piezoelectric ceramics, quartz, lithium tetraborate, gallium orthophosphates, langasite, langatate, langanites, silica and generally materials of proven acoustic quality allowing application of the structure.

Generally, the transduction plate is attached perpendicularly in the vicinity of the plane face of the block of substrate so that the width of the transduction plate and the first thickness of the block of substrate have a same direction.

Generally, the first material, the second material, the first thickness e1 of the block of substrate 4, the length L, the width I, the second thickness e2 of the transduction plate 6 are configured for generating and trapping bulk waves at the operating frequency of the transducer between its two plane faces 8, 10 and for creating a guide for guided acoustic waves propagating in the direction of the length L of the transduction plate.

During operation, the resonator is connected to the output of an electric excitation source 20 and to the input of a circuit 22 for extracting a useful signal at the resonance and working frequency f, the extraction circuit 22 forming an output load.

The electric excitation source 20, connected between the first electrode 12 and the second electrode 14, is configured for generating a voltage signal having a main sinusoidal component at the working frequency f.

The extraction circuit 22, also connected between the first electrode 12 and the second electrode 14, is configured for extracting a useful signal at the working frequency f.

According to FIGS. 1 to 3, the structure 2 therefore has metallizations positioned along the Z axis following the ZX plane, the repetition axis always being along X and the normal to the plate now being Y. The properties of this type of structures may be modeled by using simple meshing but by applying the definition of the cut angles compliant with the situation of the model: the polarization alternation along the Z axis corresponds to the cuts (YX) and (YXl)/180° which actually refer to turning over the ZX plate by 90° (instead of having two neighboring domains defined with the cuts (YXl)/90° and (YXl)/−90° respectively in the case of an excitation of the faces facing the ZX cut plate).

In the conventional case with the axis Z normal to the transduction plate, having been developed for many years, a longitudinal mode is obtained which propagates at 6,200 meters per second with relatively modest coupling (less than %).

In the case of the invention of FIG. 1, with the Y axis normal to the transduction plate 6, the obtained two main modes, the first corresponding to a longitudinal mode with a velocity of 6,300 meters per second and including coupling around about 10%, a second shear mode propagating at a velocity of 19,000 meters per second, notably better coupled (a value close to 23% is thus obtained for the coupling coefficient in the most favorable configuration in the sense of the dispersion properties of the guide).

Alternatively, it is also possible to produce a polarization such that the repetition axis is along Y, the axis X being maintained normal to the transduction plate. The metallized faces are now along the plane ZY. Substantially different conditions for excitation of the modes from those described above but also with a notably higher coupling coefficient than in the conventional case with the axis Z normal to the transduction plate, are then obtained.

The dispersive properties of both of these modes were studied for three arbitrary periods p i.e. 10 μm, 50 μm and 100 μm with 50% cyclic polarization ratio d1/p.

Regardless of the period of the transducer, the change in the electromechanical coupling is identical. Next, the frequency dispersion of the modes is all the higher since the period is small (for example for the longitudinal mode, a dispersion of 250 MHz is observed for a period of 10 μm and of only 25 MHz for a period of 100 μm.

The longitudinal mode is more stable in frequency (a factor 5 for a same period) but less coupled than the shear mode (up to 23% for the shear mode and 12% for the longitudinal mode).

The change in the coupling is not linear and has local maxima because of an overlapping phenomenon with other modes which will cross the tracked mode. Thus optimum electromechanical coupling points are detected as well as working areas where the frequency is quasi-stable so as to favor a few dimensions (width of the bar and transducer period for the manufacturing of the bars).

The influence of the length L of the plate on the acoustic response of the plate was studied for a period p of the transducer equal to 50 μm, a width I of the bar of 90 μm and a thickness e2 of 24 μm. This characterization shows the excitation of many modes at frequencies around about a hundred megahertz. Further, the greater the length L of the plate, the more extensive is the acoustic response. Indeed, the length L of the plate acts on the number of excited periods of the transducer. In this case, as the period p of the transducer is 50 μm, a length L of the transducer of more than 300 wavelengths should be preferred.

The influence of the width I of the plate on the acoustic response was studied for a configuration of the transduction plate in which the period p of the transducer is equal to 10 μm, the thickness e2 of the plate is equal to 15 μm, the length L of the plate is equal to 500 wavelengths. Several excited modes in a frequency band from 300 MHz to 1.4 GHz should be distinguished. Regardless of the width I of the plate, the frequency position of the modes is identical. Furthermore, the obtained signal is better resolved when the width of the plate I has the value of 250 μm.

Indeed, in the case of a transduction plate with alternating ferroelectric domains, the width of the plate may be related to the acoustic aperture of the device. Thus, the smaller the acoustic aperture, the more attenuated will be the response. According to various experiments and according to the written texts of Royer and Dieulesaint in <<Ondes élastiques dans les solides>> (Elastic waves in solids) (Masson Ed. 1997), from about one hundred wavelengths, the signal would be optimum.

In practice, in the case of the plate, it is difficult to observe this optimum width quantity when the sold substrates have a thickness of 500 μm at most. Indeed, if a period of 10 μm is considered, a cut-out depth of 1,000 μm would be required in order to observe the 100 λ.

Thus, in the different proposed cases, the responses of the devices will not have optimum resolution but devices may however be created with a width close to 250 μm, for which interesting performances are obtained.

It is obvious that the more the commercially sold substrates will have a great length, greater will be the plate widths I which may be attained and the obtaining of an optimum resolution signal will be more favorable.

Figure 4:
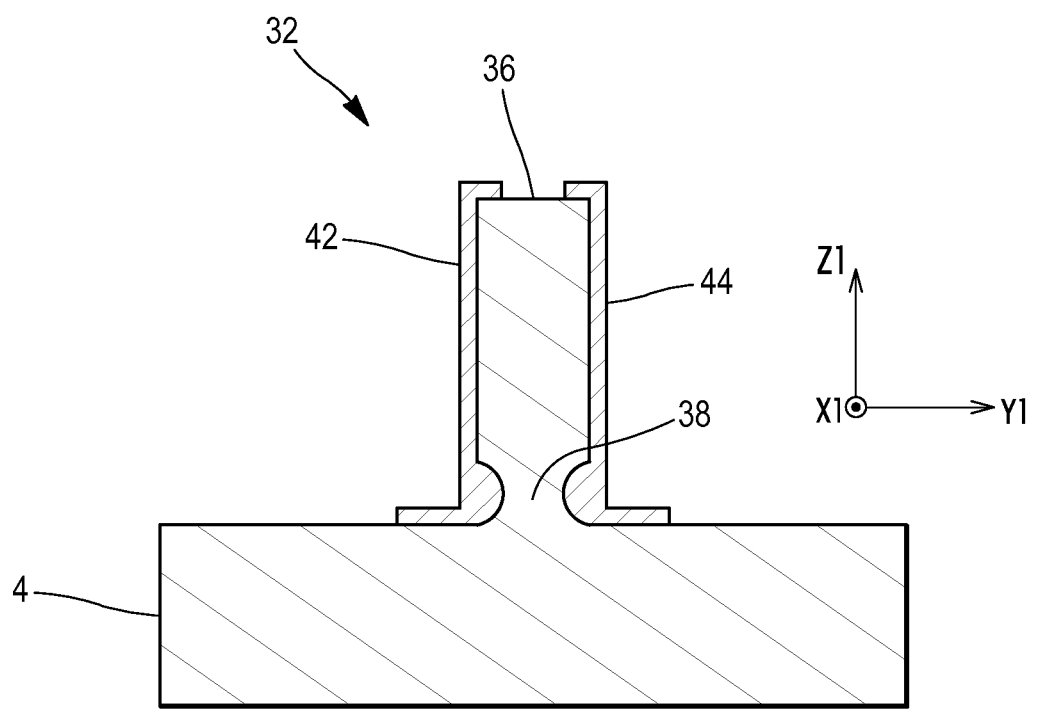
FIG. 4 is a sectional view in the direction of the thickness and of the width of the transduction plate of a another example derived from a piezoelectric transducer of FIG. 1 wherein a bottleneck separates the transduction plate from the block of substrate.

According to FIG. 4, another example of a piezoelectric transducer 32 with alternating ferroelectric polarization, derived from the resonator 2 of FIG. 1 comprises a transduction plate 36, attached in one piece to the block of substrate 4.

The materials used and the geometrical dimensions of the transduction plate 36 and of the block of substrate 4 in terms of thickness e2, of length L and of width I are identical with those of the transducer 2 of FIG. 1.

The transduction plate 36 has a constriction area 38 in the thickness of the plate in the direction of the width I over the whole of its length L.

In the constriction area 38, located in the vicinity of the plane face 16 of the block of substrate 4, the thickness of the transduction plate 36 varies and passes through a minimum.

The thinning of the transduction plate 36 formed by the constriction area 38, used at the base of the transduction plate 36, gives the possibility of insulating at best the maximum vibration area of the guided waves along the faces or flanks of the transduction plate 36 fitted into the block of substrate 4.

In this example, this structure is called a bottle-neck structure by analogy with the narrowed shape of a bottleneck.

This structure was validated for a form factor FI of 15 as contemplated for the piezoelectric transducer of FIG. 1, i.e. a width I of the plate of 75 μm for a thickness e2 of 5 μm for an optimum transducer configuration as regards coupling.

First and second electrodes 42, 44 each cover a different flank face of the plate 36 and at the foot of the plate fill the depression formed by the constriction area of the plate.

Figure 5:
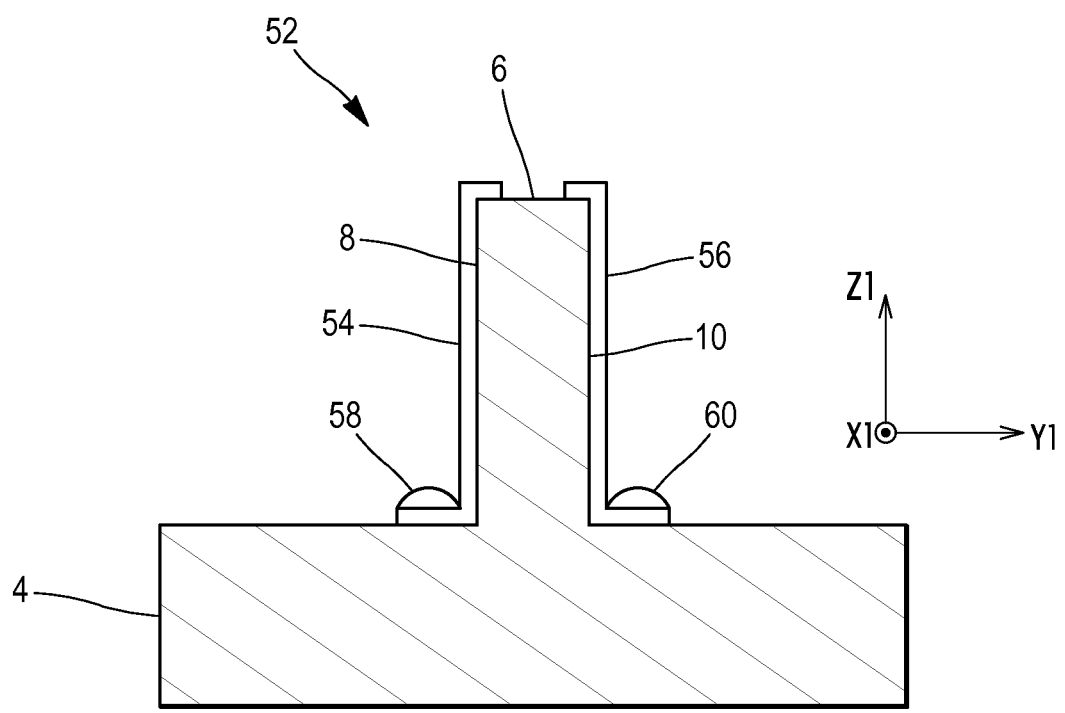
FIG. 5 is a sectional view in the direction of the thickness and of the width of the transduction plate of a further example of a transducer, derived from the resonator of FIG. 1, which applies increased metallization at the electrodes on the upper portion of the substrate.

According to FIG. 5, a further example of a piezoelectric transducer 52 with a periodic ferroelectric polarization, derived from the transducer 2 of FIG. 1, applies increased metallization at the electrodes on the high portion of the substrate.

In this example, only the first and second electrodes, designated by the numerical references 54 and 56, differ from the electrodes 12 and 14 of the piezoelectric transducer 2 of FIG. 1 in that they each comprise a different bulge 58, 60 i.e. an addition of metal.

The electrodes 54, 56 are configured through this addition of metal so as to obtain a mass effect on the high portion of the substrate and localize the maximum of the amplitude of the acoustic vibrations far from the fitting of the plate 6 to the substrate 4.

Alternatively, this mass effect may also be obtained by doping the high portion of the substrate. For most single-crystal materials, there exist doping methods giving the possibility of substituting or even integrating within the lattice, foreign atoms to the crystalline structure in order to locally modulate the properties of the material.

A method particularly used in optics with lithium niobate relates to proton exchange, for example described in the article of Toshiaki Suhara, Shuji Fujiwara, <<Proton-exchanged Fresnel lenses in TILiNbO$_3$ waveguides>>, Applied Optics, Vol. 25, Issue 19, pp. 3379-3383 (1986), which allows diffusion of light atoms (hydrogen, titanium, etc.) within the crystalline lattice with or without structural modifications.

It is also possible to substitute heavier atoms (erbium, MgO, etc.) inside the crystal lattice by high temperature diffusion as described by Arnaud Grisard in the thesis of Nice University-Sophia Antipolis, U.F.R. Faculté des Sciences, 1997 entitled <<Laser Guides d'ondes dans le niobate de lithium dopé en Erbium>>. (Laser wave guides in lithium niobate doped with erbium). It is thus possible to locally modify the elastic properties of the material by modifying the mass density and thereby generate the required guiding conditions depending on the selected crystal orientation.

Figure 6:
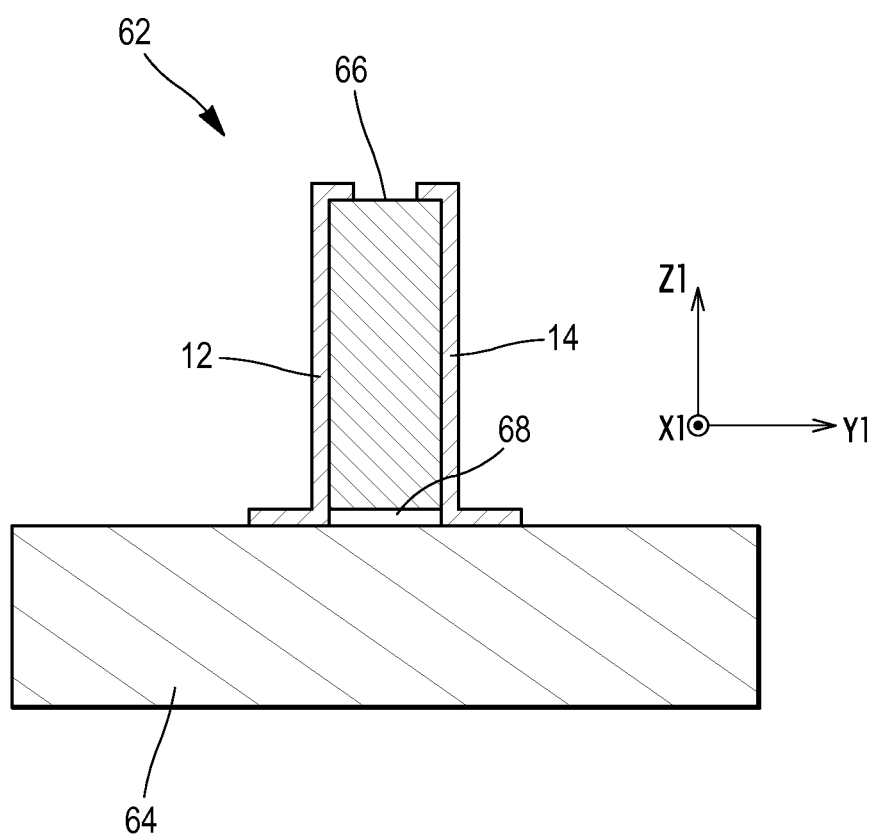
FIG. 6 is a sectional view in the direction of the thickness and of the width of the transduction plate of a yet further example of a piezoelectric transducer, with a geometrical shape identical with that of the resonator of FIG. 1 wherein an attachment element connects the transduction plate to the block of substrate.
Figure 7:
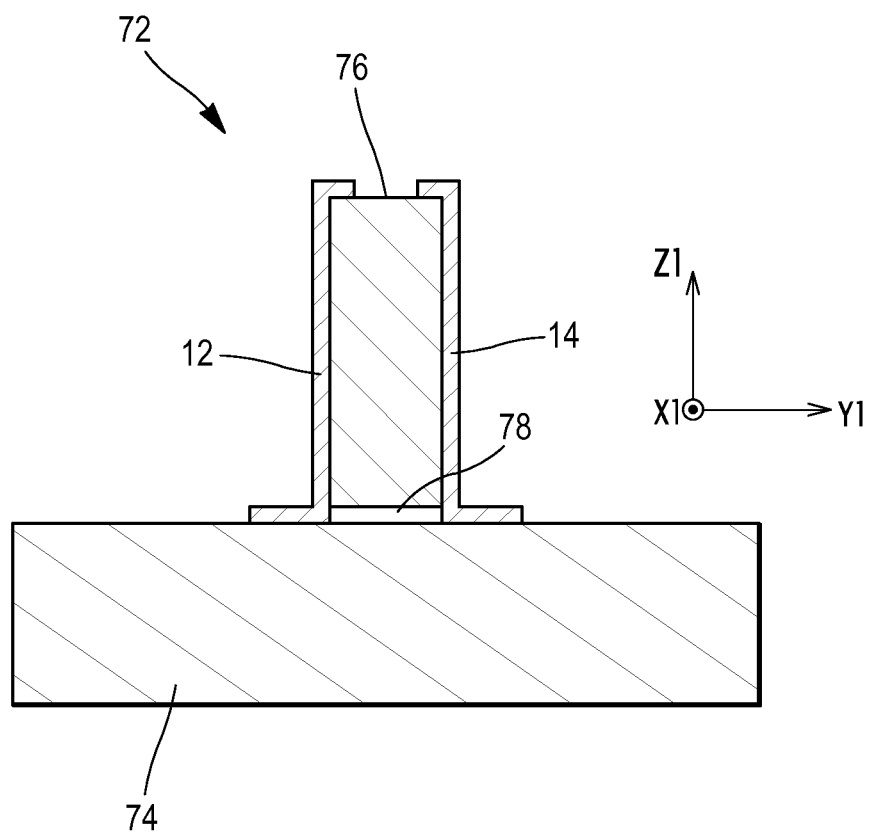
FIG. 7 is a sectional view in the direction of the thickness and of the width of the transduction plate of an example of a piezoelectric transducer, with a geometrical shape identical with that of the resonator of FIG. 1 wherein an acoustic insulation element connects the transduction plate to the block of substrate.

According to FIGS. 6 and 7, other structures of piezoelectric transducers with periodic ferroelectric polarization allow improvement in the trapping of the guided wave along and in the transduction plate.

According to FIG. 6, a yet further example of a piezoelectric transducer 62 with alternating ferroelectric polarization comprises a block of substrate 64 and a piezoelectric transduction plate 66, the materials of which are different.

The material of the transduction plate 66 has piezoelectric properties and comprises ferroelectric domains, for which the polarizations are alternating polarizations.

The shape and the geometrical dimensions of the block of substrate 64 and of the transduction plate 66 are identical with that of the block of substrate 4 and of the transduction plate 6 of FIG. 1.

According to FIG. 6, the block of substrate 64 and the transduction plate 66 are distinct parts connected together through a connection element 68 like an acoustically transparent adhesive joint, here.

An adhesive joint may be understood as a polymeric layer, deposited for example by centrifugation, and cross-linked in order to generate a solid bond between the material of the plate and the material of the block of substrate, or further metal layers deposited on the faces to be adhesively bonded and used for transfer by inter-metallic diffusion, Au, In, Cu being the most used materials for this purpose, to the extent that these layers will not short-circuit the electrodes facing each other, deposited on the flank faces of the transduction plate, or further silica layers deposited on the faces to be adhesively bonded and activated so that their hydrophilicity allows molecular bonding either identical with or similar to the one applied for so-called SOI (Silicon-On-Insulator, TM SOITEC) substrates, or further a so-called <<glass-frit>> bond consisting in the sintering of a paste loaded with silica giving rise to a rigid bond of high structural quality.

The first material of the block of substrate 64 is selected so that the propagation velocities of the bulk waves propagating therein are greater than those of the second material.

For example, the second material forming the transduction plate 66 is selected according to the nature of the first material from among lithium niobate or tantalate, quartz, langasite or any other single-crystal piezoelectric material, deposited on a diamond carbon layer, or if necessary, more simply on silicon or sapphire making up the first material of the block of substrate.

According to FIG. 7, an example of the transducer 72 derived from transducer of FIG. 6, comprises a block of substrate 74 and a transduction plate 76 for which the materials are identical.

The transducer 72 comprises an acoustic insulation element 78, positioned between the block of substrate 74 and the transduction plate 76, and attached to the latter with two adhesive joints not shown in FIG. 6.

The acoustic insulation element 78 is here a Bragg mirror, made here with a stack of layers with highly contrasting acoustic impedances.

The highly contrasting acoustic impedance layers are for example layers of aluminum nitride or silicon nitride and silicon oxide, the stack being configured for reflecting in phase and for completely the bulk waves at the contemplated working frequencies.

Alternatively, the first material making up the substrate and the second material making up the plate are different.

The examples of FIGS. 6 and 7 may be generalized by considering that the transducer comprises an attachment and/or acoustic insulation element distinct from the block of substrate and the transduction plate, consisting in at least one third material distinct from the first and second material, the attachment and/or acoustic insulation element being comprised in the set formed by a single adhesive layer, a Bragg mirror formed with a stack of layers with contrasting acoustic impedances.

Figure 8:
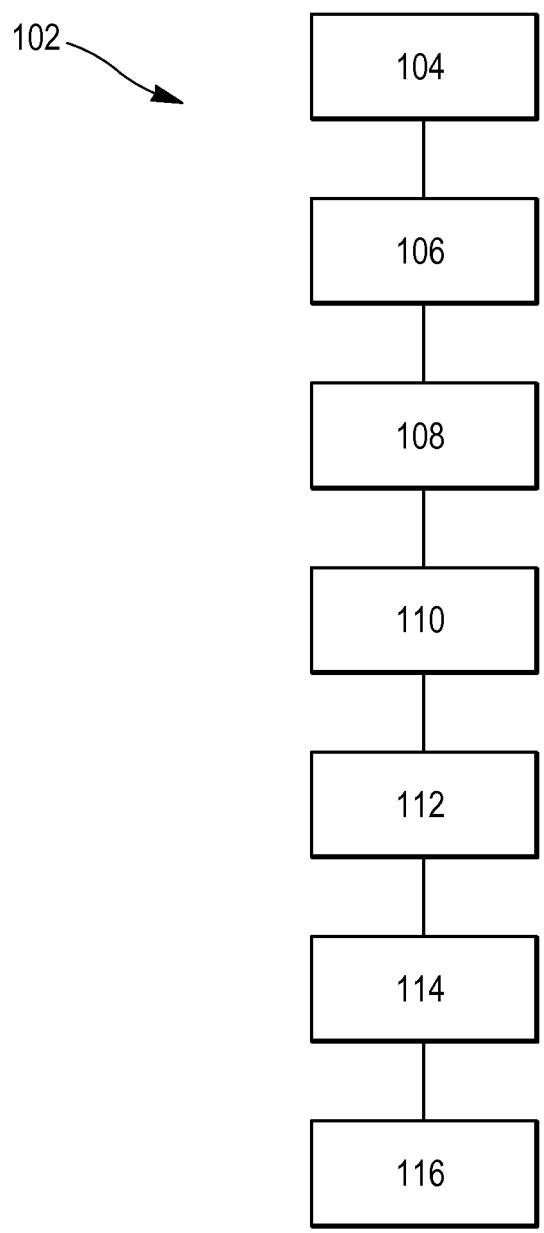
FIG. 8 is a flow chart of a method for manufacturing the piezoelectric transducer of FIG. 1.

According to FIG. 8, a complete method 102 for making a transducer of FIG. 1, including at least one transduction plate connected in one piece and perpendicularly mounted on a block of substrate, comprises a series of steps 104, 106, 108, 110, 112, 114, 116.

The micro-manufacturing steps are applicable for any lithium niobate or lithium tantalate cut.

Here, the raw starting material of the method is a raw slice of lithium niobate designated as a <<wafer>> in which ferroelectric domains with alternating polarization have been generated according to a periodic pattern.

Generally, under the cover of determining the suitable sawing conditions, the method is applicable to any piezoelectric and ferroelectric single-crystal material which has been electrically polarized periodically.

The use of a precision saw, for example a saw of the Disco® brand which allows in two saw cuts, the two planes to be defined of the faces of the resonant plate.

The machine used for cutting out transduction plates with alternating ferroelectric domains is for example a precision saw DISCO® DAD 321, the reference of the blades used is DPAN 0781, the technical references corresponding to the reference P1A 863 BR10/56×0.2×40.

The thickness e2 resolution of a piezoelectric transduction plate is defined by the precision in the alignment between both saw cuts and may attain 1 µm in the best of cases.

The width $\underline{I}$ of the transduction plate is defined as for it, by the required cut depth in the crude wafer of lithium niobate along the direction of the thickness of the block of substrate which will be finally made. This width $\underline{I}$ may attain several hundred µm.

In a sawing operation, the sequence of the following steps is for example applied:

using a new blade recommended for optimum polish quality, straightening out of the blade consisting of centering the blade after having physically placed it on the support of the machine, as well as sharpening the abrasive grains of the blade when making the cutout lines, cutting out the plate input and output faces over the whole length of the device, making plates or bars.

The conditions for cutting out the plates are for example the following:

complete cutting out of the input and output faces of the future plates by considering the following cutting out parameters: advance rate equal to 0.18 mm.s$^{-1}$, speed of rotation of the abrasive disc equal to 9,000 revolutions per minute, cut out over the total width;

making the plates with an advance rate equal to 0.18 mm.s$^1$, a speed of rotation of the abrasive disc equal to 9,000 revolutions per minute, a cutout on the width targeted to be a thickness of the crude substrate slice (wafer).

The thickness and the length of the plates may vary at will, the quality of the surface condition of the flanks of the plates being deemed as being an optical polish.

In a first step 104, a crude wafer of lithium niobate is provided for which the initial cut is noted as ZX in the direction of the thickness with a first upper face and a second lower face. The crude wafer which has piezoelectric and ferroelectric properties comprises first positive polarization domains along the oriented axis Z and second negative polarization domains, i.e. of opposite direction to the axis Z, the first domains and the second domains being distributed in the direction of the X axis while alternating according to a repetition pattern, the repetition pattern being defined by a pitch p and a cyclic ratio.

In a second step 106, the upper face of the lithium niobate wafer having for a normal the Z axis is coated with a resin, for example the resin S 1828 of the Shipley brand. The deposition of the resin is carried out for example with a method of the spin coating type over a thickness of 2.5 µm. In the same step 106, the resin is annealed in an oven for 1 hour at 95° Celsius in order to evaporate the solvents and to thereby make it more resistant to the cutting-out step with the saw.

In a third step 108, a plate or several transduction plates are cut out along a cut plane ZX. In order to configure the sawing of a transduction plate, here four saw cuts are at least required for producing the plate. Indeed, as the width of the blade of the saw is of 200 µm, two superposed saw cuts are made in order to obtain an accessible space of 350-400 µm on either side of the plate for allowing tests under probe tips.

During the third step 108, the thickness e2 and the width I of at least one transduction plate are defined by the depths of the cuts and the precision in the alignment in the series of two saw cuts as well as the widths of the electrodes by the superposition of two saw cuts.

Once the third step 108 is carried out, in a fourth step 110, at least one band in the direction of the length on each free face of the top of the plates as well as bands in the direction of the length on saw faces of the substrate located between plates are covered with the protective resin S 1828.

In a fifth step 112, metal electrodes are deposited on the lateral faces, i.e. the flanks of the plates, as well as at the bottom of the trenches with a width comprised between 350-400 µm over a length L which may attain several centimeters.

In order to cover the flanks of a plate or of a series of plates forming a slot over a width I which may attain several hundred µm, an aluminum deposit is made by sputtering in three times by tilting the chip, formed by the substrate and the plates, for example twice by 45° around an axis oriented in the direction of the length L of the plates.

In this fifth step 112, the entire chip is covered with the aluminum layer and the electrodes are then obtained by the so-called lift-off technique. For this, the chip is immersed in a solvent bath (remover), for example remover 1165, a chemical solution dissolving the protective resin, here the resin S 1828, heated to 70° for several hours.

The lift-off is then accelerated and completed by using an ultrasonic bath for one minute.

Next in a sixth step 114, in order to solidify the plates or bars before a second step 116 for longitudinally cutting out the transduction plates, the piezoelectric transduction plates or bars are coated with a protective resin S1805 by means of the coating technique designated as spray-coating. This sixth step 114 gives the possibility of covering with resin the structured niobate wafers, i.e. the chips provided with their electrodes.

The seventh and last step 116 consists of defining the length L of the plates or bars by cutting out with the saw, for example here in our case, a length L of 500 µm. This seventh step 116 is rather critical and may cause breakage and therefore the loss of many plates. Indeed, the question here is to make saw cuts perpendicular to the slotted surface every 500 µm along the direction of the length L and over a depth greater than the first cutting-out depth, i.e. the width I of the plates, in order to make each thereby formed elementary chip, electrically independent.

According to FIG. 9, a first intermediate state 202 of the transducer 2 of FIG. 1, obtained at the end of the second step 106 of the method 102, is a stack of a layer 204 of resin S1828 and of a crude lithium niobate wafer 206.

The crude wafer 206 has piezoelectric and ferroelectric properties and comprises first positive polarization domains along the oriented axis Z and second negative polarization domains, i.e. in the direction opposite to the Z axis, the first domains and the second domains being distributed in the direction of the X axis while alternating according to a repetition pattern, the repetition pattern being defined by two adjacent ferroelectric domains of different polarization, a pitch p and a cyclic ratio.

According to FIG. 10, a second intermediate state 212 of the transducer 2 of FIG. 1 manufactured by the method 102, obtained at the end of the third sawing step 108 comprises a block of substrate in which a plate 216 surrounded on either side with a recess or a naked, i.e. exposed, valley 218, 220 was vertically machined in FIG. 10. Two end bars 222, 224 of the block 214 surround the transduction plate 216 which is unique here. A resin layer 226 is deposited on a top face 228 of the plate and on top faces 230, 232 of the bars 222, 224 as well as two bands of recesses 234, 236 positioned on either side of the plate 216.

According to FIG. 11 a third intermediate state 242 of the transducer 2 of FIG. 1 manufactured by the method 102, obtained at the end of the lift-off step 112 of deposition of the electrodes is a structured chip.

Here, the chip 242 comprises a single transduction plate 216 with two electrodes 244, 246 in aluminum on either side of its two flanks, each electrode 244, 246 will slightly jut out on the top face 228 of the plate 216 and on a portion of the floor face of the substrate 214 at the foot of each flank of the transduction plate 216.

This structure after cutting out the edges of the substrate corresponds to the structure of the transducer 2 of FIG. 1.

Figure 12:
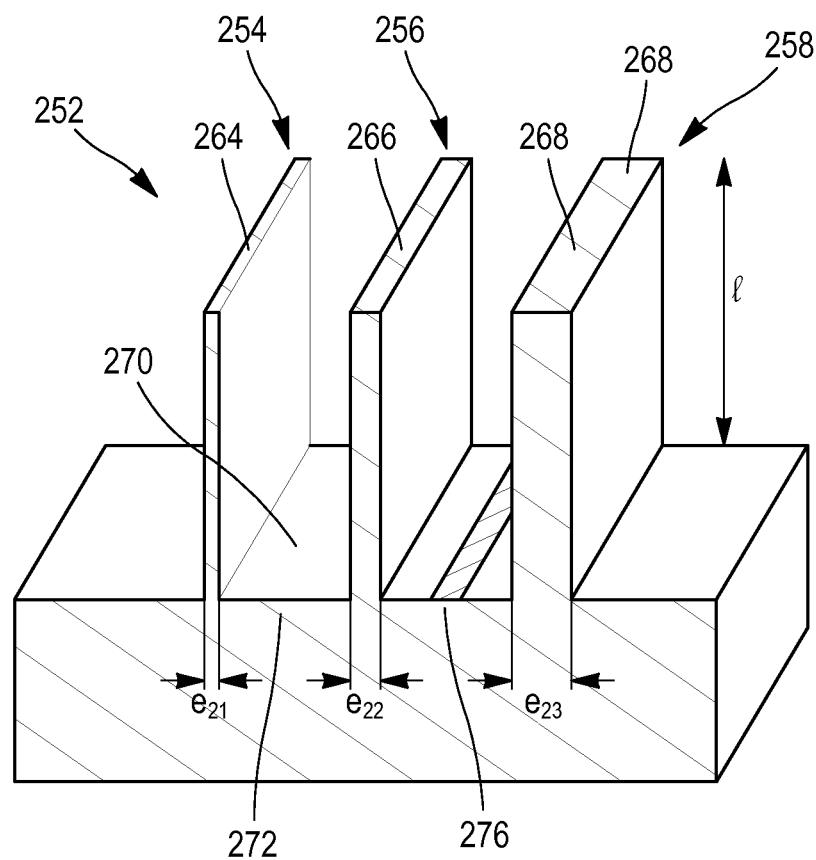
FIG. 12 is a view of a chip integrating on a same substrate a set of several piezoelectric transducers as described in FIGS. 1 to 7.

According to FIG. 12, a chip 252 forming a complex resonant surface, comprising three elementary transducers 254, 256, 258 of the type of that of FIG. 1 each formed with a different transduction plate 264, 266, 268. Each transduction plate 264, 266, 268 of same width I has a different thickness e21, e22, e23.

The first two transduction plates 264, 266, illustrated on the left in FIG. 11, are coupled with each other by sharing a same electrode 270, made by a metal connection deposited on a floor 272 of a common substrate.

The first two transduction plates 264, 266 are electrically separated from the third plate 268 by an insulating band 276.

Figure 13:
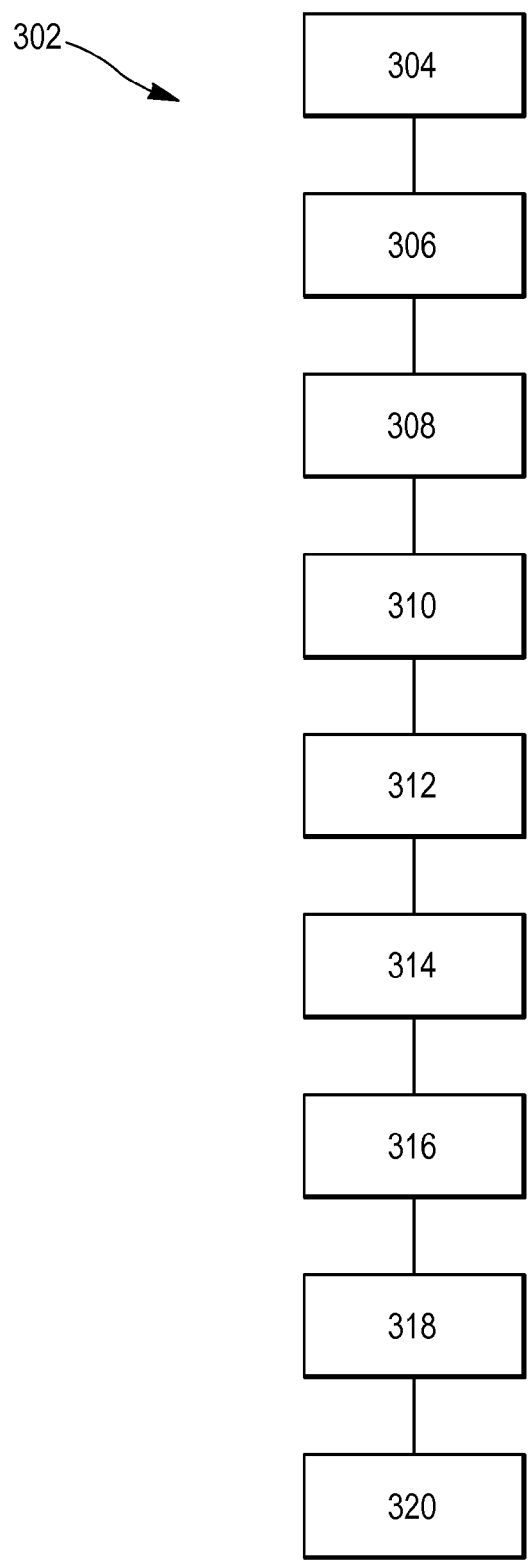
FIG. 13 is a flowchart of a method for manufacturing the piezoelectric transducers of FIG. 6 or of FIG. 7.
Figure 17:
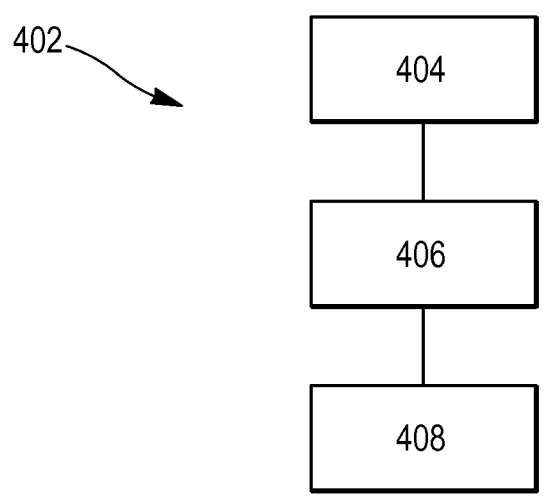
FIG. 17 is a flow chart of a manufacturing method generalizing the manufacturing methods 8 and 13.

According to FIG. 13, a complete method 302 for making a transducer of FIG. 6 or FIG. 7, including at least one piezoelectric transduction plate with a periodic ferroelectric polarization, connected through a means of attachment and/or acoustic insulation by being mounted perpendicularly on a block of substrate comprises a series of steps 304, 306, 308, 310, 312, 314, 316, 318, 320.

Here, the attachment and/or acoustic insulation mean is a Bragg mirror, positioned between the plate and bar and the substrate. The Bragg mirror is made here with a stack of layers with highly contrasting acoustic impedances, layers of aluminum nitride or silicon nitride and silicon oxide for example, the stack being configured for reflecting in phase and completing the bulk waves at the contemplated working frequencies.

In a first step 304, a first lithium niobate wafer is provided for which the initial layer is noted as ZX in the direction of the thickness with a first upper face and a second lower face. The crude wafer which has piezoelectric and ferroelectric properties comprises first positive polarization domains and second negative polarization domains, the first domains and the second domains being distributed in the direction of the X axis while alternating according to a repetition pattern, the repetition pattern being defined by a pitch p and a cyclic ratio.

In a second step 306, a Bragg mirror is positioned on the upper face of the lithium niobate substrate, the surface of the mirror having sufficient extent for isolating a significant number of resonant plates.

The mirror is made here by stacking layers of highly contrasting acoustic impedances and with a wide extent, layers of aluminum nitride or silicon nitride and silicon oxide for example, the stack being configured for reflecting in phase and completely the bulk waves at the contemplated working frequency.

The Bragg mirror is attached to the substrate with an adhesive bonding method with preliminary deposition of an adhesive joint.

This mirror then consists of a stack of transferred materials according to methods listed above (polymer adhesive bonding, metal diffusion, molecular bonding) and thinned for attaining the required thicknesses, which may notably vary according to the targeted operating frequencies.

More particularly for radiofrequency applications, the required layer thicknesses may prove to be compatible with plasma-assisted, physical or chemical, solid or vapor phase deposition methods (evaporation, sputtering, chemical vapor deposition, molecular jets, etc.), giving rise to stacks of layers of a few μm each with a thickness of a fraction of μm. It is thus possible to produce multiple layers having controlled thicknesses and to give rise to a mirror with a great reflection efficiency, close to that of an air gap.

In a third step 308, a layer of a piezoelectric transducer is deposited on the Bragg mirror. The transduction layer is a second crude lithium niobate wafer, the initial cut of which is noted as ZX in the direction of the thickness with a first upper face and a second lower face. Like the first crude wafer, the second crude wafer has the same piezoelectric and ferroelectric properties and comprises first positive polarization domains and second negative polarization domains, the first domains and the second domains being distributed in the direction of the X axis while alternating according to a repetition pattern, the repetition pattern being defined by a pitch p and a cyclic ratio.

The crystallographic orientation of the material of the piezoelectric transducer and the configuration of its ferroelectric domains are selected so that when the transduction layer is cut out along the direction of the thickness of the substrate through two planes parallel with each other and with a normal direction Y, the electro-acoustic coupling coefficient is high and the configuration is favorable for generating and trapping elastic bulk waves at the operating frequency of the transducer, guided between two plane faces ZX and propagating in the direction of the X axis which will be the orientation selected for the length of the transduction plate.

Here, it is assumed that the material of the transduction layer is the same as the material of the substrate, i.e. in lithium niobate with the same implanted configuration of the ferroelectric domains.

This gives the possibility of using a same initial wafer which is cut into two equal portions, a first portion being used as a substrate layer and a second portion being used as a transduction layer.

However, alternatively, the substrate material may be different from that of the transduction layer provided that it keeps the same features as described above for the transduction layer. In other words, the transduction layer is necessarily formed with a piezoelectric and ferroelectric material in which ferroelectric domains with alternating polarization are implanted, as opposed to the substrate layer which may be without any ferroelectric domains and even not consist in a ferroelectric material.

The attachment of the transduction layer on the Bragg mirror is achieved by means of an adhesive joint for example.

In a fourth step 310, similar to the second step 106 of the method 102, the upper face of the lithium niobate wafer forming the transducer is coated with a resin, for example the resin S 1828 of the Shipley brand. The deposition of the resin is carried out for example with a spin coating type method over a thickness of 2.5 μm. In the same step, the resin is annealed in an oven for one hour at 95° Celsius in order to evaporate the solvents and to thereby make it more resistant to the cutting-out step with the saw.

In a fifth step 312, similar to the third step 108 of the method 102, one plate or several transduction plates are cut out in the stack following parallel planes with a direction ZX.

In order to configure the sawing of a resonant plate, here four saw cuts are at least required in order to make the plate. Indeed, as the width of the blade saw is of 200 μm, two superposed saw cuts are made in order to obtain an accessible space of 350-400 μm on either side of the plate in order to allow tests under probe tips.

During the fifth step 312, the thickness e2 and the width I of at least one plate are defined by the depth of the cutouts and by the precision in the alignment between the series of two saw cuts as well as the width of the electrodes by the superposition of two saw cuts.

Once the fifth step 312 is carried out, a sixth step 314, identical with the fourth step 110 of the method 102 is carried out.

In a seventh step 316, identical with the fifth step 112 of the method 102, metal electrodes are deposited.

Next, in an eighth step 318, the transduction plates or bars are coated with a protective resin S1805 by means of the spray-coating technique. This eighth step gives the possibility of covering with resin the structured niobate wafers, i.e. the chips provided with their electrodes.

The ninth and last step 320 consists of defining the length L of the plates or bars by cutting out with the saw, for example here in our case a length L of 500 µm.

According to FIG. 13, a first intermediate state 322 of the transducer of FIG. 7, obtained at the end of the second step 306 of the method 302, is a stack of a first crude lithium niobate wafer 324 with alternating ferroelectric polarization intended to form the holding substrate, of a layer 326 forming a Bragg mirror hemmed in two adhesive joints, of a second crude lithium niobate wafer 328 with alternating ferroelectric polarization intended to form at least one transduction plate after machining, and a layer 330 of S1828 resin.

According to FIG. 15, a second intermediate state 332 of the transducer of FIG. 7, obtained at the end of the third sawing step 308, comprises the block of substrate 324, a transduction plate 336 machined in the whole of the layers 326, 328, 330, surrounded on either side with a recess or a naked, i.e. exposed, valley 338, 340. Two end bars 342, 344 of the chip 332 surround the transduction plate 336 which is unique here. A resin layer 346 is deposited on a top face 348 of the plate 336 and on top faces 350, 352 of the bars 342, 344 as well as on two bands of recesses 354, 356 positioned on either side of the plate 336.

According to FIG. 16, a third intermediate state 362 of the transducer of FIG. 7, obtained at the end of the lift-off step of deposition of the electrodes, is a structured chip.

Here, the chip 362 comprises a single transduction plate 336 with two electrodes 364, 366 in aluminum on either side of its two flanks, each electrode 364, 366 will slightly jut out of the top face 348 of the plate 336 and on a portion of the floor face of the substrate 324 at the foot of each flank of the transduction plate 336.

This structure after cutting out the edges of the substrate corresponds to the structure of the transducer of FIG. 7.

Generally, a method 402 for manufacturing a transducer as described in FIGS. 1 to 7 comprises three steps 404, 406, 408.

In a third step 404, an initial piezoelectric transduction plate crude layer is provided. The initial transduction plate crude layer consists in a piezoelectric and ferroelectric material, having a crude layer thickness eb, and a spatial extent in a plane perpendicular to the direction of the thickness clearly larger than the thickness eb of the crude layer. The initial crude layer comprises first positive polarization domains and second negative polarization domains, the first domains and the second domains being distributed in the direction of a length of the crude layer while alternating according to a repetition pattern, the repetition pattern being defined by a pitch p and a cyclic ratio.

The crystallographic orientation of the crude layer and the direction of the ferroelectric polarizations were selected beforehand so that there exists a crystallographic cut plane of the crude layer in the direction of the thickness eb and of the length of the crude layer for which a wafer, cut out according to the cut plane and having a thickness e2, produces, when it is hemmed in by plane metal electrodes with a normal in the direction of the thickness e2, a piezoelectric and ferroelectric transducer with alternating polarization, in which guided bulk waves propagate in the direction of the length of the wafer, with an electro-acoustic coupling coefficient greater than or equal to 0.01%.

In a second step 406, a piezoelectric and ferroelectric transduction plate is cut out in the direction of the thickness of the crude layer and partly or totally in the initial resonant plate crude layer.

The cut-out transduction plate has a resonant plate thickness e2, first and second plane faces positioned facing each other, the plane faces having a length L, a width I and, the cutting-out is carried out with a machining method along the direction of the cut plane, the width I of the plate and the thickness of the crude layer being of the same direction, the material and the crystallographic orientation of the crude layer, the direction of the cut plane, the length L, the width I, the second thickness of the resonant plate being configured so as to generate and trap bulk waves at the operating frequency of the transducer between its two plane faces, and for creating a guide for guided acoustic bulk waves propagating in the direction of the length of the transduction plate.

In a third step 408, first and second metal electrodes are deposited covering at least partly the first face and the second face of the resonant plate respectively. The first and second metal electrodes are at least partly facing each other.

For a given surface, it is thus possible by means of the invention to multiply the number of transducers considerably according to at least a factor of 10 by making use of the most advantageous single-crystal cuts in terms of electromechanical coupling for applications to frequency filters, in terms of stability in temperature for applications to stable frequency sources, in terms of sensitivity to stresses for applications to sensors, generally by combining these various features for producing a given application function.

The applications of the piezoelectric and ferroelectric transducers described above are the following:
  strong coupling filters,
  high frequency resonators,
  temperature, acceleration sensors,
  gyrometers,
  torque, acceleration, stress sensors,
  acousto-optical modulators with strong confinement, strong modulation,
  resonators for sensors and in particular wireless sensors which may be queried in IFM bands,
  resonators for high temperature sensors (on materials such as stoichiometric lithium niobate and tantalate, single-crystal ceramics with a high Curie temperature),
  resonators for accelerometric, gyroscopic, gravimetric sensors,
  elements for modulating optical signals by acoustic-optical coupling.

The materials which may be utilized for these operations are lithium niobate, tantalate and potassium niobate for strong coupling filters and (potentially piezoelectric ceramics and ceramic single-crystals of the relaxation type), lithium tetraborate. For sensors and in particular for high temperature sensors (adequate electrodes selected for this type of application, i.e. platinum, iridium, zirconium or rubidium electrodes or any other electrode notoriously robust at high temperature), and generally any other ferroelectric single-crystal available in the form of a sufficiently thick plate (a minimum of 200 µm) for allowing machining of the bars as shown.

For lithium niobate and tantalate, it is possible to reduce the thermal sensitivity of the resonators by covering them with an amorphous silica deposit, the temperature coefficient of the frequency of which has a positive sign and allows compensation for the negative sign of that of these materials.

Thus, one makes the most out of the remarkable single-crystal properties in terms of electromechanical coupling, of very high phase velocities, of confinement, of acousto-optical coupling.

Thus, plates with a thin thickness, for example 5 µm, give the possibility of optimizing the operating points over a spectral range ranging from a few tens of MHz to several GHz.

Thus, it is possible to have particularly advantageous connecting modes between transducers for structures of filters with impedance elements, but especially the use of guided elastic waves in structures with strong coupling coefficients and resonance quality for frequencies which may be difficult to attain by conventional thinning/polishing planar methods. The combination of such structures with layers of selected properties for example allows optimization of the properties of the corresponding components. For example, by making a lithium niobate plate equipped with an electrode and covered with a layer of suitable silica thickness, it is possible to produce a resonator with very strong coupling which may range up to 23%, compensating for temperature effects.

By using shear waves having a higher phase velocity it is possible to have applications at a notably higher working frequency than with <<conventional>> surface modes.

The invention claimed is:

1. A bulk wave piezoelectric transducer operating at a predetermined frequency f and comprising:
   a block of substrate comprising a plane face having a first thickness along a normal to the plane face and comprising of a first material, and
   a piezoelectric transduction plate comprising a first and a second plane face positioned facing each other, having a length, a width and a second thickness, and comprised of a second piezoelectric material,
   first and second metal electrodes covering at least partly the first face and the second face of the piezoelectric transduction plate respectively and at least partly facing each other,
   wherein:
   the piezoelectric transduction plate is formed by a ferroelectric material layer which comprises first domains with a positive polarization and second domains with a negative polarization, the first domains and the second domains being distributed in the direction of the length of the piezoelectric transduction plate alternately according to a repetition pattern, the repetition pattern being defined by a pitch and a cyclic ratio, and
   the piezoelectric transduction plate is attached perpendicularly in the vicinity of the plane face of the block of substrate so that the width of the piezoelectric transduction plate and the first thickness of the block of substrate have a same direction, and
   the first material, the second material, the first thickness of the block of substrate, the length, the width, the second thickness of the piezoelectric transduction plate, the pitch are configured in order to generate and trap bulk waves at the operating frequency of the transducer, which are guided between both of the plane faces of the piezoelectric transduction plate, the guided acoustic waves propagating in the direction of the length L of the transduction plate.

2. The bulk wave piezoelectric transducer according to claim 1, wherein the second piezoelectric material has a crystallographic cut noted ZX according to the IEEE Std -176 standard revised in 1949, a crystallographic axis X and a crystallographic axis Z being respectively directed along the length and the width of the piezoelectric transduction plate, a polarization axis of the ferroelectric domains being collinear with the Z axis and a repetition axis being directed along the X axis.

3. The bulk wave piezoelectric transducer according to claim 1, wherein the second piezoelectric material has three crystallographic axes X, Y, Z, a crystallographic cut noted ZX according to the IEEE Std-176 standard revised in 1949, the crystallographic axis Y and the crystallographic axis Z being respectively directed along the length L and the width l of the piezoelectric transduction plate, the polarization axis of the ferroelectric domains being collinear with the Z axis, and the repetition axis being directed along the Y axis.

4. The bulk wave piezoelectric transducer according to claim 1, wherein a lateral form factor Fl, defined as the ratio of the width l of the piezoelectric transduction plate over the second thickness of the piezoelectric transduction plate, is greater than or equal to 5, preferably greater than or equal to 10.

5. The bulk wave piezoelectric transducer according to claim 1, wherein a longitudinal form factor, defined as the ratio of the length of the piezoelectric transduction plate over the thickness of the piezoelectric transduction plate, is a multiple of a wavelength, which is greater than or equal to 10, preferably greater than or equal to 100, the wavelength being equal to the phase velocity of a wave divided by the frequency.

6. The bulk wave piezoelectric transducer according to claim 1, wherein the piezoelectric transduction plate and the block of substrate consist in a same piezoelectric material and form a part in one piece, wherein the block of substrate comprises first domains of positive polarization and second domains of negative polarization, the first domains and the second domains of the block of substrate being distributed in the direction of the length of the plate with the same distribution of the ferroelectric polarization as that of the piezoelectric transduction plate in the direction of the length.

7. The piezoelectric transducer according to claim 1, comprising an attachment element and/or an acoustic insulation element at the operating frequency, which is distinct from the block of substrate) and from the piezoelectric transduction plate, consisting in at least one third material distinct from the first and second materials, the attachment element and/or the acoustic insulation element being comprised in the set formed by a single adhesive layer, a Bragg mirror formed with a stack of layers with contrasting acoustic impedances.

8. The piezoelectric transducer according to claim 1, wherein:
   the piezoelectric transduction plate and the block of substrate consist in a same piezoelectric material and comprise ferroelectric domains polarized according to a same repetition pattern with identical direction and orientation of the polarization; and
   the crystallographic cut and the polarizations of the ferroelectric domains of the piezoelectric transduction plate are configured so that bulk waves with transverse or longitudinal polarizations are generated with an electroacoustic coupling coefficient greater than 0.01% and guided between the two electrodes while propagating in the direction of the length of the piezoelectric transduction plate.

9. The piezoelectric transducer according to claim 1, wherein the piezoelectric transduction plate has a constriction area in the direction of the thickness and over the whole of the length thereof, for which the thickness of the piezoelectric transduction plate passes by a minimum, and the piezoelectric transduction plate being attached to the block of substrate, the constriction area is located in the vicinity of the plane face of the block of substrate.

10. The piezoelectric transducer according to claim 1, wherein:
- the first material is comprised in the set of materials formed by diamond-carbon, silicon, sapphire, silicon carbide, quartz, lithium niobate, lithium tantalate, potassium niobate, piezoelectric ceramics, quartz, lithium tetraborate, gallium orthophosphate, langasite, langatate, langanite, silica, and
- the second material is comprised in the set of materials formed by lead oxide, titanium, PZT zirconium, lithium tantalate LiTaO3, lithium niobate LiNbO3, potassium niobate PbTiO3, and ferroelectric materials with a high crystalline quality.

11. The piezoelectric transducer according to according to claim 1, wherein:
- the metal electrodes are made in a material comprised in the set of materials formed by aluminum, platinum, iridium, zirconium, rubidium, copper, titanium, molybdenum, nickel, tungsten, gold, poly-silicon, the alloys of these different metals, and
- the thickness of the metal electrodes is distributed so as to obtain a distribution of mass localized at the boundary of the piezoelectric transduction plate and of the block of substrate so as to trap and concentrate the bulk waves inside a local area of the piezoelectric transduction plate.

* * * * *